United States Patent
Ozard

(10) Patent No.: US 7,586,720 B1
(45) Date of Patent: Sep. 8, 2009

(54) ELECTROSTATIC DISCHARGE PROTECTION DEVICE

(75) Inventor: Kenneth Sean Ozard, North Plainfield, NJ (US)

(73) Assignee: Anadigics, Inc., Warren, NJ (US)

( * ) Notice: Subject to any disclaimer, the term of this patent is extended or adjusted under 35 U.S.C. 154(b) by 498 days.

(21) Appl. No.: 11/002,345

(22) Filed: Dec. 2, 2004

(51) Int. Cl.
  *H02H 3/22* (2006.01)
(52) U.S. Cl. .......................................... 361/56; 361/111
(58) Field of Classification Search ............. 361/56–58, 361/91.1, 111
  See application file for complete search history.

(56) References Cited

U.S. PATENT DOCUMENTS

| | | | | |
|---|---|---|---|---|
| 3,873,905 A | * | 3/1975 | Marek | 323/350 |
| 5,886,862 A | * | 3/1999 | Anderson et al. | 361/56 |
| 6,292,343 B1 | * | 9/2001 | Pequignot et al. | 361/111 |
| 6,317,305 B1 | * | 11/2001 | Dedic | 361/56 |
| 6,327,125 B1 | * | 12/2001 | Colclaser et al. | 361/56 |
| 6,492,859 B2 | * | 12/2002 | Vashchenko et al. | 327/310 |
| 6,888,710 B2 | * | 5/2005 | Mallikarjunaswamy et al. | 361/56 |
| 7,288,450 B1 | * | 10/2007 | Tailliet | 438/210 |
| 2006/0152870 A1 | * | 7/2006 | Chen et al. | 361/56 |

* cited by examiner

*Primary Examiner*—Danny Nguyen
(74) *Attorney, Agent, or Firm*—Ward & Olivo

(57) ABSTRACT

A compact ESD protection device is described that uses the reverse breakdown voltage of a base-emitter junction as a trigger diode to switch a transistor that shunts the forward bias ESD current to ground. The trigger diode in series with a leakage diode provides a path to shunt the reverse bias ESD current to ground. The leakage diode is matched to the trigger diode to shunt any leakage current from the trigger diode to ground.

14 Claims, 9 Drawing Sheets

ELECTROSTATIC DISCHARGE PROTECTION DEVICE

BACKGROUND OF THE INVENTION

1. Field of the Invention

The present invention relates to microelectronic integrated circuits or modules. More specifically, the invention relates to electrostatic discharge (ESD) protection of microelectronic circuits.

2. Description of the Related Art

Electrostatic discharge remains a significant cause of rejections during the manufacturing of electronic devices and remains an important issue throughout the use and lifetime of the product. The input and output pins are especially vulnerable to ESD as users attach or detach external devices, such as antennas for example, from these pins. Metal oxide semiconductors (MOS) are known to be especially susceptible to ESD that can destroy the thin oxide layer of the MOS device and irreparably damage the MOS. The bipolar junction transistor (BJT) is usually considered to be less susceptible to ESD than MOS but small heterojunction bipolar transistors (HBT), such as InGaP HBTs for example, are particularly susceptible to damage from ESD. Other structures that are especially susceptible to ESD include integrated capacitors and adjacent metal lines on the semiconductor die.

The ESD can damage or reduce the life of an electrical device by exceeding the breakdown capability of dielectrics used in the integrated circuits as described in the Actel ESD Primer White Paper, downloaded from http://www.actel.com/documents/ESD%20Primer_WP.pdf, (March, 2004), herein incorporated by reference. The dielectrics susceptible to ESD often include the capacitor and passivation dielectrics. ESD may also damage the semiconductor layers in the active device. One common approach to reducing the damage caused by unwanted ESD provides a shunt path that directs the ESD current away from the electrical device. Another approach to reducing the damage caused by ESD is to provide a robust path around, or parallel to, a sensitive device by adding a protection circuit.

U.S. patent application publication no. US 2004/0057172 A1 published on Mar. 25, 2004, herein incorporated by reference in its entirety, discloses ESD protection circuits that provide current shunt paths to protect electrical devices.

FIG. 1 is a schematic diagram illustrating an ESD protection circuit. The circuit is comprised of two branches 106, 108 in parallel to each other between the first port 101 and the second port 102. The forward branch 106 provides a path for excess current from the first port 101 to the second port 102. The reverse branch 108 provides a path for excess current from the second port 102 to the first port 101.

In the forward branch 106, a base diode stack 120 is connected in series with a resistor 122 in a voltage divider configuration between the first and second ports 101, 102. The base of a triggering transistor 130 is connected to the voltage divider. The emitter of the triggering transistor 130 is connected to the second port 102. A collector diode stack 140 is connected between the first port 101 and the collector of the triggering transistor 130 and dissipates the bulk of the excess power through the forward branch 106 of the circuit. The base diode stack 120 is selected to set the triggering threshold of the forward branch 106. Resistor 122 is selected to keep the triggering transistor 130 off during normal operation and to adjust the switch-off time of the triggering transistor 130 during an ESD event. The collector diode stack 140 may be one or more diodes connected in series or may be one or more transistors configured as diodes connected in series.

During normal operation, the triggering transistor 130 is off thereby preventing current flow from the high voltage node 101 to the low voltage node 102. When the voltage increases above the sum of the diode junction drops in the base diode stack 120, current from the high voltage node 101 flows through the base diode stack 120 and through the resistor 122. As the current increases further, the voltage across resistor 122 turns the triggering transistor 130 on and allows current to flow through the collector diode stack.

The reverse branch 108 is similar to the forward branch 106 and comprises a reverse triggering transistor 135, a reverse collector diode stack 145 and a reverse base diode stack 125. During operation, the reverse triggering transistor 135 remains off until the voltage at the second port 102 exceeds the sum of the diode junction drops in the reverse base diode stack 125 plus the base-emitter turn-on voltage (the base-emitter diode junction drop) of the reverse triggering transistor 135. When the reverse base diode stack 125 begins conducting current, the reverse triggering transistor 135 switches on after the transistor's base-emitter voltage drop is exceeded and a current begins to flow through the reverse collector diode stack 145 from the second port 102 to the first port 101.

Although the circuit of FIG. 1 is effective at preventing damage from ESD events, the diode capacitances detrimentally affect operation at RF frequencies. Furthermore, the large part count of the circuit increases the die area required to incorporate the circuit into an RF design. Therefore, there remains a need for an effective ESD protection device capable of operating at high frequencies and requiring a smaller additional die area.

SUMMARY OF THE INVENTION

One embodiment of the present invention is directed to an ESD protection circuit comprising: a clamping transistor, the clamping transistor having a base; a triggering transistor, the triggering transistor having a base connected to the base of the clamping transistor; a leakage transistor, the leakage transistor having an emitter connected to the base of the clamping transistor; a first port, the first port connected to a collector of the clamping transistor and connected to an emitter of the triggering transistor; and a second port, the second port connected to an emitter of the clamping transistor and connected to a base of the leakage transistor.

Another embodiment of the present invention is directed to an ESD protection circuit comprising: a clamping transistor, the clamping transistor having a base, an emitter, and a collector; a first port connected to the collector of the clamping transistor; a second port connected to the emitter of the clamping transistor; a triggering diode having an anode and a cathode, the anode of the triggering diode connected to the base of the clamping transistor and the cathode of the triggering diode connected to the first port; and a leakage diode having an anode and a cathode, the anode of the leakage diode connected to the emitter of the clamping transistor and the cathode of the leakage diode connected to the base of the clamping transistor.

Another embodiment of the present invention is directed to an ESD protected circuit comprising: a microelectronic circuit having at least one power supply port; a first ESD protection circuit, wherein the first port of the first ESD protection circuit is connected to a power supply and the second port of the first ESD protection circuit is connected to the at least one power supply port of the microelectronic circuit; and a second ESD protection circuit, wherein the first port of the second ESD protection circuit is connected to ground and the second port of the second ESD protection circuit is connected to the at least one power supply port of the microelectronic circuit. In some embodiments, the microelectronic circuit and the ESD protection circuits are fabricated on the same die.

BRIEF DESCRIPTION OF THE DRAWINGS

The invention will be described by reference to the preferred and alternative embodiments thereof in conjunction with the drawings in which.

DETAILED DESCRIPTION

Figure 1:
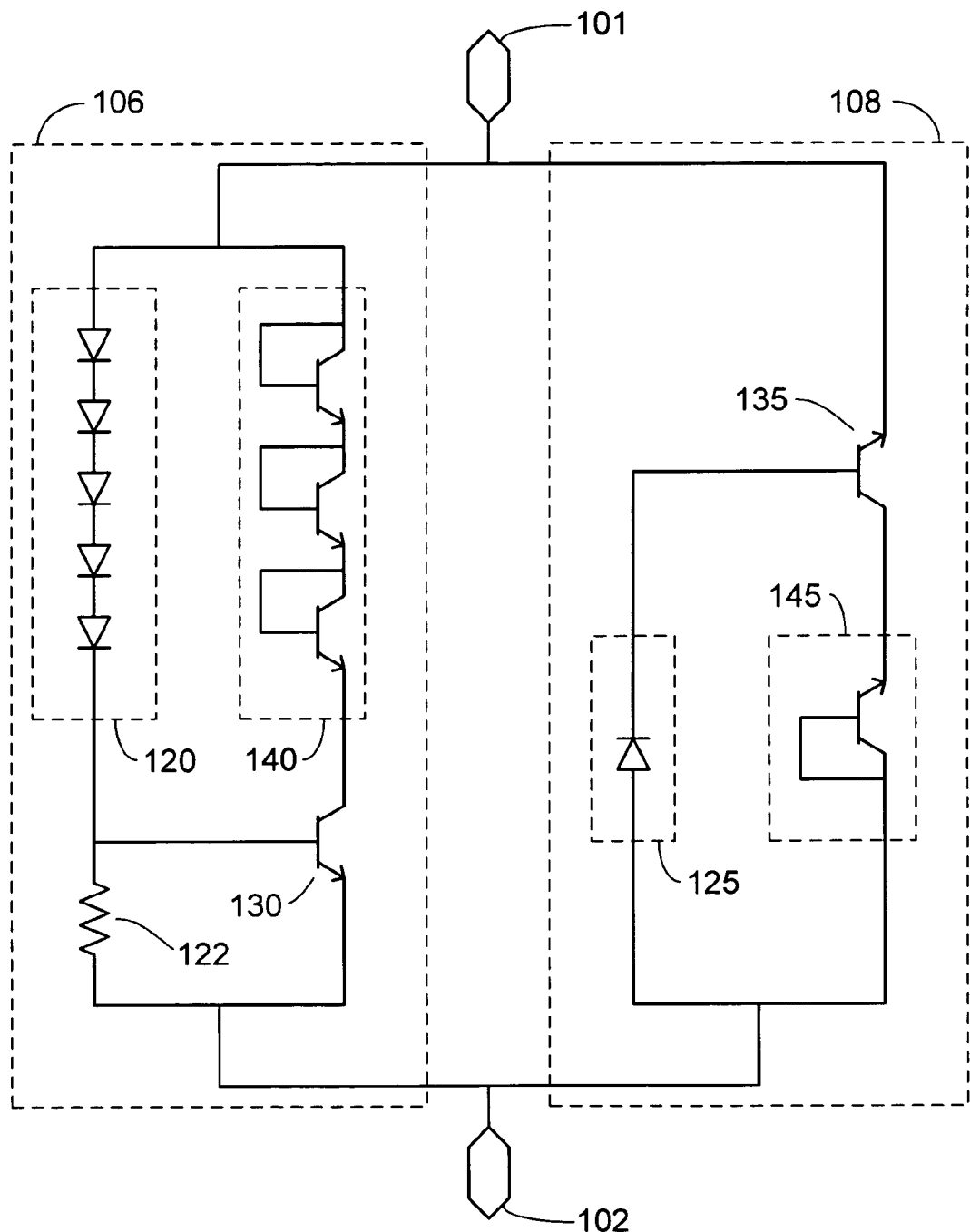
FIG. 1 is a schematic diagram of a typical ESD circuit.
Figure 2:
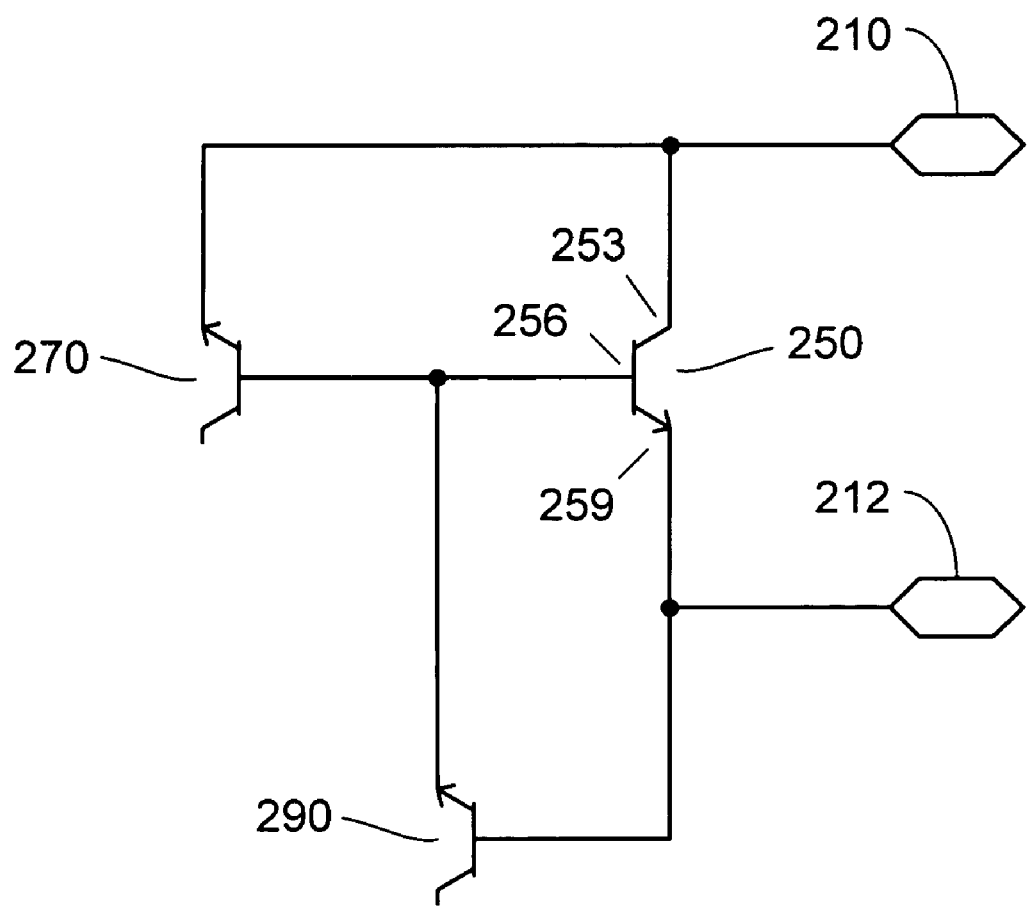
FIG. 2 is a schematic diagram of one embodiment of the present invention.

FIG. 2 is a schematic diagram of one embodiment of the present invention. In FIG. 2, an asymmetric ESD circuit capable of diverting ESD currents in both directions is shown connected between a first port 210 and a second port 212. Each port 210, 212 provides an electrical contact to portions of other electrical circuits where ESD protection is desired.

The circuit comprises a clamping transistor 250, a triggering transistor 270, and a leakage transistor 290. The collector 253 of the clamping transistor 250 is connected to the first port 210 and to the emitter of triggering transistor 270. The base 256 of the clamping transistor 250 is connected to the base of the triggering transistor 270 and to the emitter of leakage transistor 290. The emitter 259 of the clamping transistor 250 is connected to the second port 212 and to the base of the leakage transistor 290. In a preferred embodiment, triggering transistor 270 and the leakage transistor 290 are matched in design, layout and device characteristics such that the leakage transistor 290 has a greater reversed biased base-emitter leakage current than trigger transistor 270.

The operation of the circuit is now described. When the voltage at the first port 210 is greater than the voltage at the second port 212, the reversed biased base-emitter junction of the triggering transistor 270 prevents current flow from the first port 210 into the base 256 of the clamping transistor 250 until the voltage across the first port 210 and second port 212 exceeds the breakdown voltage of the base-emitter junction plus the turn-on base-emitter voltage drop of the clamping transistor 250. In some embodiments, the breakdown voltage of the triggering transistor is between 5 and 10 volts, preferably between 7 and 8 volts. When the breakdown voltage of the base-emitter junction of the triggering transistor 270 is exceeded, sufficient current flows into the base 256 of the clamping transistor 250 such that clamping transistor 250 turns on thereby allowing current to flow from the first port 210 through the collector 253 and the emitter 259 of the clamping transistor 250 to the second port 212.

The leakage transistor 290 provides a shunt path when the voltage at the second port 212 is greater than the voltage at the first port 210 by about two base-emitter voltage drops. When the voltage at the second port 212 is greater than the voltage at the first port 210 by about two base-emitter voltage drops, the base-emitter junctions of the leakage transistor 290 and the triggering transistor 270 are forward biased and shunt the current from the second port 212 through the base-emitter junctions of the leakage transistor 290 and the triggering transistor 270 to the first port 210.

The leakage transistor 290 also provides a leakage path such that leakage currents from the base-emitter junction of the triggering transistor 270 does not turn on the clamping transistor 250. If the leakage current from the leakage transistor 290 flows into the base 256 of the clamping transistor 250, the clamping transistor 250 may start to turn-on before the desired turn-on or protection threshold in the forward biased direction. When the clamping transistor 250 begins to turn-on, the protection circuit leaks current in the forward biased direction. Such an undesired leakage could, for example, slowly drain a battery in a portable device.

In a preferred embodiment, the leakage transistor 290 and triggering transistor 270 are matched in design, layout and device characteristics such that the leakage transistor 290 has a greater reversed biased base-emitter leakage current than trigger transistor 270. In a preferred embodiment, the base-emitter junction area of the leakage transistor 290 is sized to be larger than the base-emitter junction area of the triggering transistor 270 to ensure a larger leakage current of the leakage transistor 290.

Figure 3:
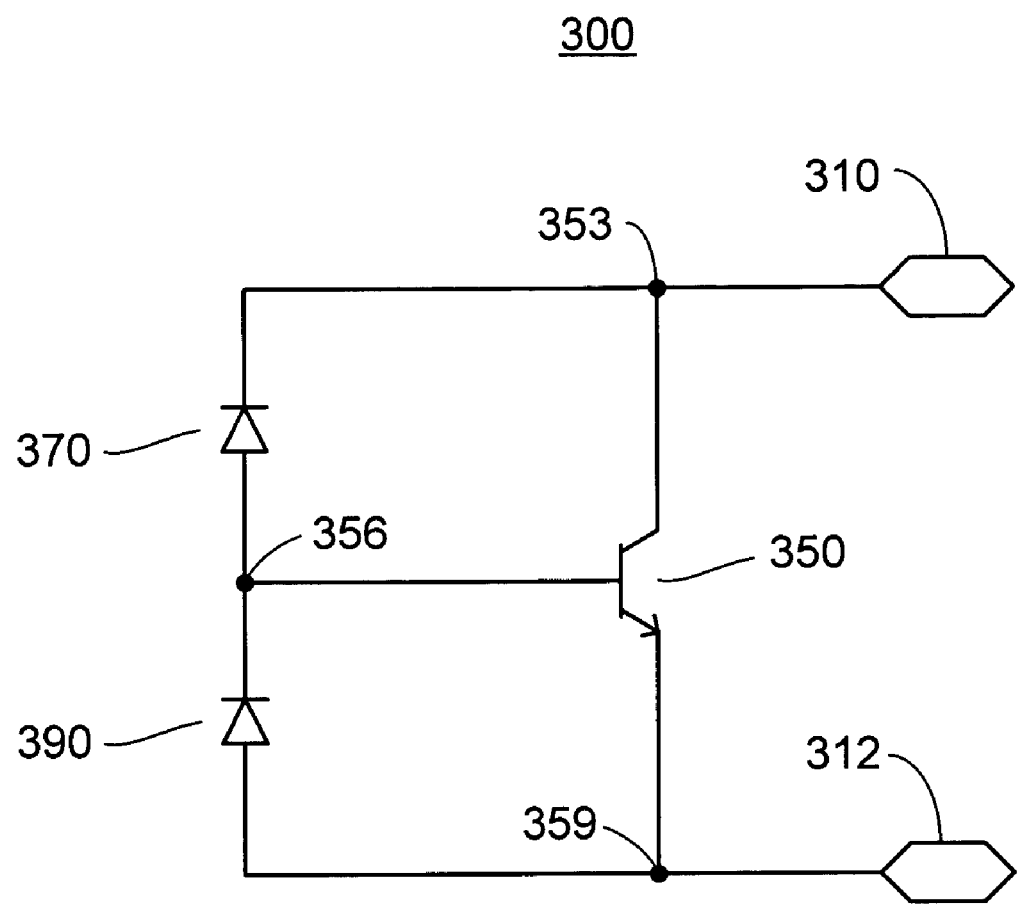
FIG. 3 is a schematic diagram of another embodiment of the present invention.

FIG. 3 is a schematic diagram of another embodiment of the present invention. In the embodiment shown in FIG. 3, the collector 353 of the clamping transistor 350 is connected to the first port 310 and the emitter 359 of the clamping transistor 350 is connected to the second port 312. The anode of the triggering diode 370 is connected to the base 356 of the clamping transistor 350. The cathode of the triggering diode 370 is connected to the first port 310 and the collector 353 of the clamping transistor 350. The anode of the leakage diode 390 is connected to the emitter 359 and the second port 312. The cathode of the leakage diode 390 is connected to the base 356 of the clamping transistor 350 and the anode of the triggering diode 370.

Triggering diode 370 maintains clamping transistor 350 in the off state until the voltage difference between the first and second ports exceeds the sum of the reverse bias breakdown voltage of the triggering diode 370 plus the base-emitter turn-on voltage (the base-emitter diode junction drop) of the clamping transistor 350, hereinafter referred to as the forward turn-on voltage of the protection circuit. When the voltage across the first and second ports exceeds the forward turn-on voltage of the protection circuit, a reverse current flows from the first port through the triggering diode 370 and into the base 356 of the clamping transistor. The reverse current turns the clamping transistor on thereby allowing current to flow from the collector 353 to the emitter 359. Leakage currents from the triggering diode 370 are diverted through the leakage diode 390 to keep the clamping transistor off until the voltage between the first and second ports 310 and 312, respectively exceeds the sum of the triggering diode's breakdown voltage and the turn-on base-emitter voltage of the clamping transistor 350.

The triggering diode 370 and leakage diode 390 provide a reverse path for the ESD current when the voltage at the second port 312 exceeds the voltage at the first port 310 by about two p-n junction voltage drops.

The ESD circuit shown in FIG. 3 is asymmetric in that the voltage required to shunt the current in the forward direction, or from the first port to the second port, is different from the voltage required to shunt the current in the reverse direction, or from the second port to the first port. In the forward direction, the excess current is not shunted through the clamping transistor until the voltage applied across the first and second ports exceeds the forward turn-on voltage of the protection circuit. In the reverse direction, the excess current is not shunted through the leakage and triggering diodes until the voltage exceeds about the sum of the two p-n junction drops.

Figure 4:
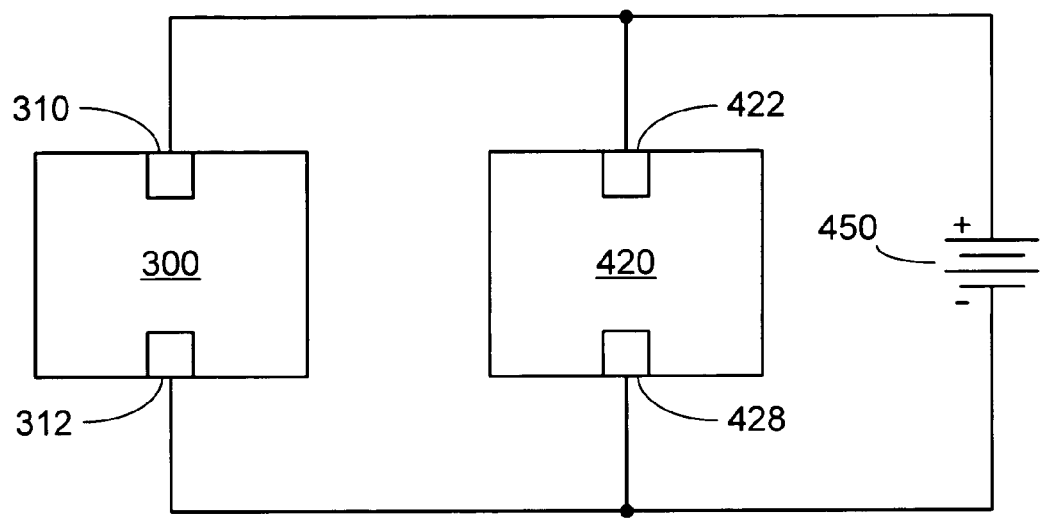
FIG. 4 is a schematic diagram illustrating an embodiment of the present invention.

FIG. 4 is a schematic diagram illustrating an embodiment of the present invention incorporating the circuit of FIG. 3. The ESD protected circuit 400 shown in FIG. 4 includes an electronic circuit 420 having a positive voltage supply pad 422 connected to a positive terminal of a power supply 450 and a negative voltage supply, or ground, pad 428 connected to a negative terminal of a power supply 450. The ESD protection circuit 300 of FIG. 3 includes a first port 310 and a second port 312. As an illustrative example, the first port 310 of the ESD protection circuit 300 is in electrical contact with the power supply pad 422 of the electronic circuit 420. The second port 312 of the ESD protection circuit 300 is in electrical contact with the negative, or ground, pad 428 of the electronic circuit 420. Alternatively, the ESD protection circuit of FIG. 2 may be substituted for the circuit of FIG. 3. In a preferred embodiment, ESD protection circuit 300 and the electronic circuit 420 are fabricated on the same die.

Figure 5A:
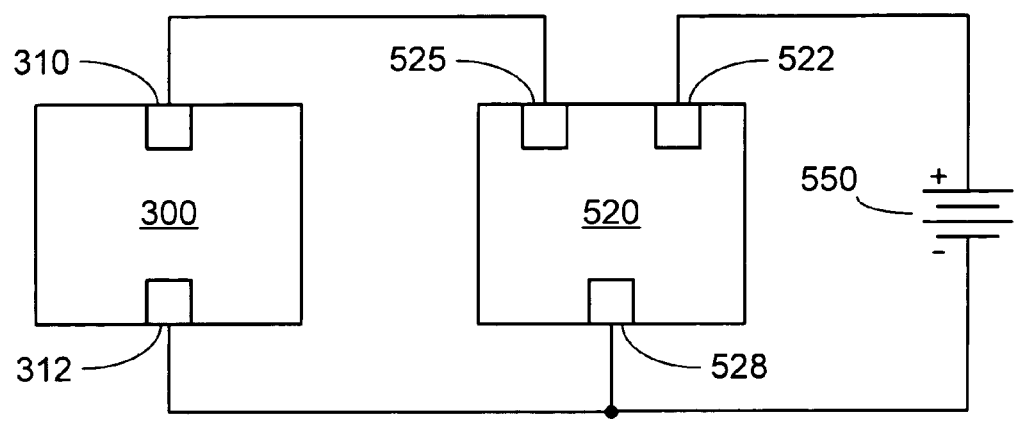
FIG. 5a is a schematic diagram illustrating another embodiment of the present invention.
Figure 5B:
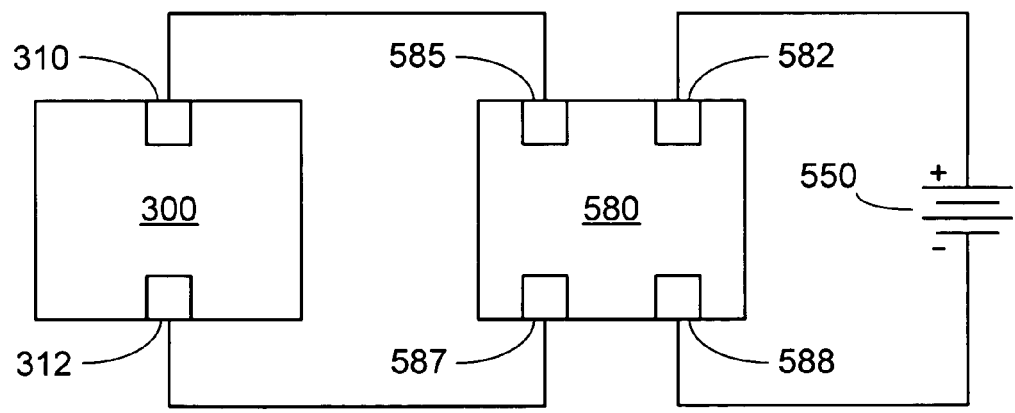
FIG. 5b is a schematic diagram illustrating another embodiment of the present invention.

FIGS. 5a and 5b are schematic diagrams illustrating alternate configurations to that of FIG. 4. The configurations shown in FIGS. 5a and 5b illustrate how the ESD protection circuit may be used to protect an input or an output or an internal point of the electronic circuit 520. In FIG. 5a, a positive voltage supply pad 522 of electronic circuit 520 is connected to a positive terminal of a power supply 550. A ground pad 528 of the electronic circuit 520 is connected to a ground or negative supply terminal of the power supply 550. The electronic circuit 520 includes an external connection pad 525 that may be an input point, an output point, or an internal point of the electronic circuit 520. The external pad 525 is connected to a first port 310 of an ESD protection circuit 300 while a second port 312 is connected to ground. FIG. 5a illustrates the use of the ESD protection circuit shown in FIG. 3 although the circuit of FIG. 2 may be substituted in FIG. 5a. The ESD protection circuit protects the external pad 525 by shunting excess ESD currents appearing at the external pad 525 through the ESD protection circuit 300 to ground.

In FIG. 5b, a positive voltage supply pad 582 of an electronic circuit 580 is connected to a positive terminal of a power supply 550. A ground pad 588 of the electronic circuit 580 is connected to a ground or negative supply terminal of the power supply 550. The electronic circuit 580 includes a first external connection pad 585 that may be an input point, an output point, or an internal point of the electronic circuit 580 and a second external connection pad 587 that may be an input point, an output point, or an internal point of the electronic circuit 580. The first external pad 585 is connected to a first port 310 of an ESD protection circuit 300 and the second external connection pad 587 is connected to a second port 320 of protection circuit 300. FIG. 5b illustrates the use of the ESD protection circuit shown in FIG. 3 although the circuit of FIG. 2 may be substituted in FIG. 5b. The ESD protection circuit protects the external pad 585 from an ESD by shunting the excess current through the ESD protection circuit 300 to external connection pad 587 that can safely handle the excess ESD current. The configuration shown in FIG. 5b does not connect the ESD protection circuit 300 to the power supply and thereby avoids any problems, such as RF isolation for example, that may arise from directly connecting the ESD protection circuit 300 to the power supply.

Figure 6A:
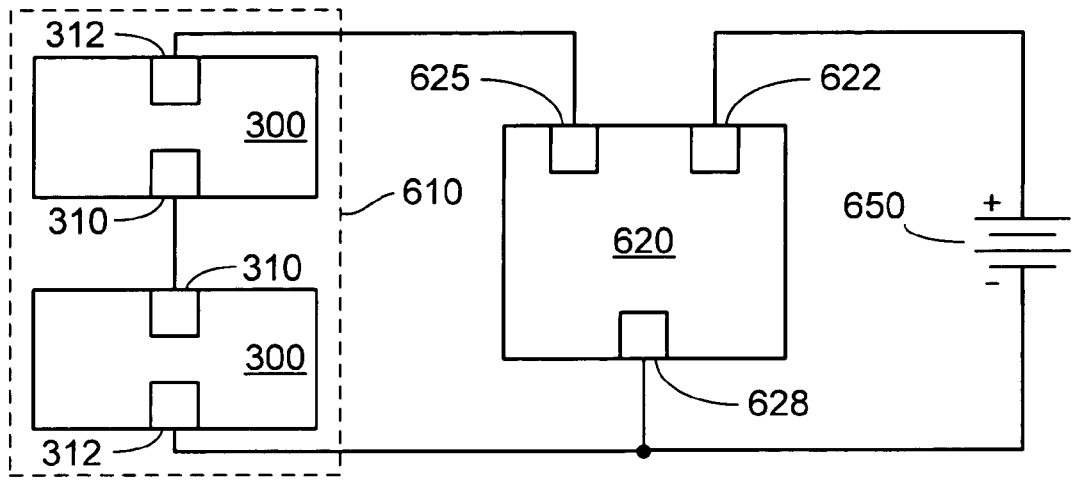
FIG. 6a is a schematic diagram illustrating another embodiment of the present invention.
Figure 6B:
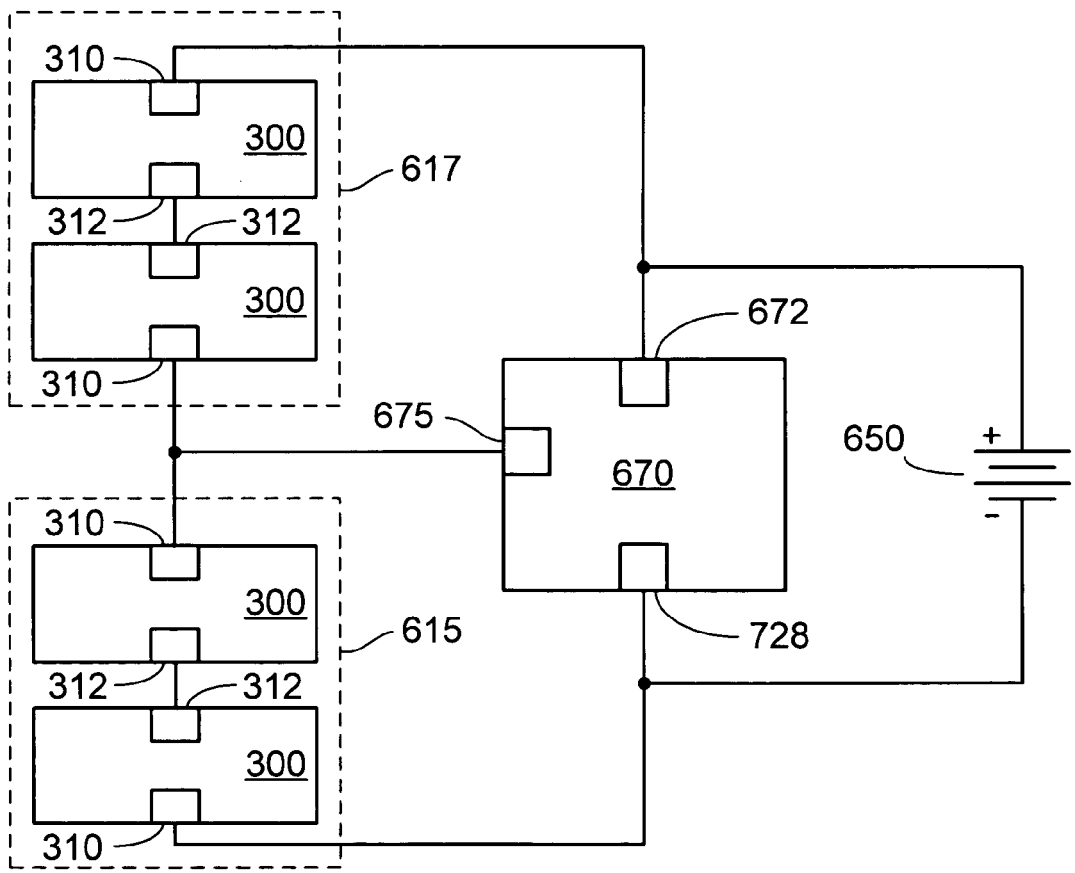
FIG. 6b is a schematic diagram illustrating another embodiment of the present invention.

FIGS. 6a and 6b are schematic diagrams illustrating configurations that include symmetric ESD circuits. In FIG. 6a, a positive voltage supply pad 622 of an electronic circuit 620 is connected to a positive terminal of a power supply 650. A ground pad 628 of the electronic circuit 620 is connected to a ground or negative supply terminal of the power supply 650. The electronic circuit 620 includes an external connection pad 625 that may be an input point, an output point, or an internal point of the electronic circuit 620. A symmetric ESD circuit 610 is connected between the external pad 625 and the ground pad 628 of the electronic circuit 620. The symmetric ESD circuit 610 protects the external pad 625 by shunting excess ESD currents appearing at the external pad 625 through the symmetric ESD protection circuit 610 to ground.

The symmetric ESD circuit 610 includes two asymmetric ESD circuits, such as the circuit described in FIG. 3, for example, connected back-to-back with each other. The symmetric ESD circuit 610 in FIG. 6a illustrates a configuration where a first port 310 of a first asymmetric ESD circuit 300 is connected to a first port 310 of a second asymmetric ESD circuit 300. The symmetric ESD circuit 610 is symmetric in the sense that the forward turn-on voltage of the protection circuit 610 is substantially equal to the reverse turn-on voltage of the protection circuit 610. In the configuration shown in FIG. 6a, the forward turn-on voltage of the protection circuit 610 is the sum of the reverse bias breakdown voltage of the triggering diode plus the base-emitter turn-on voltage (the base-emitter diode junction drop) of the clamping transistor plus the forward pn junction drop of the triggering diode plus the forward pn junction drop of the leakage diode.

In FIG. 6b, a positive voltage supply pad 672 of the electronic circuit 670 is connected to a positive terminal of a power supply 650. A ground pad 678 of the electronic circuit 670 is connected to a ground or negative supply terminal of the power supply 650. The electronic circuit 670 includes an external connection pad 675 that may be an input point, an output point, or an internal point of the electronic circuit 670. A first symmetric ESD circuit 615 is connected between the external pad 675 and the ground pad 678 of the electronic circuit 670. The first symmetric ESD circuit 615 protects the external pad 675 by shunting excess ESD currents appearing at the external pad 675 through the symmetric ESD protection circuit 615 to ground. A second symmetric ESD circuit 617 is connected between the positive power pad 672 and the external pad 675 of the electronic circuit 670. The second symmetric ESD circuit 617 protects the external pad 675 by shunting excess ESD currents appearing at the external pad 675 through the symmetric ESD protection circuit 615 to the positive power pad 672.

The second symmetric ESD circuits 615 and 617 include two asymmetric ESD circuits, such as the circuit described in FIG. 3, for example, connected back-to-back with each other. The symmetric ESD circuits 615 and 617 in FIG. 6b illustrate configurations where a second port 312 of a first asymmetric ESD circuit 300 is connected to a second port 312 of a second asymmetric ESD circuit 300. The symmetric ESD circuits 615 and 617 are symmetric in the sense that the forward turn-on voltage of the protection circuits 615 and 617 is substantially equal to the reverse turn-on voltage of the protection circuits 615 and 617. In the configuration shown in FIG. 6b, the forward turn-on voltage of the protection circuits 615 and 617 is the sum of the reverse bias breakdown voltage of the triggering diode plus the base-emitter turn-on voltage (the base-emitter diode junction drop) of the clamping transistor plus the forward pn junction drop of the triggering diode plus the forward pn junction drop of the leakage diode.

Figure 7:
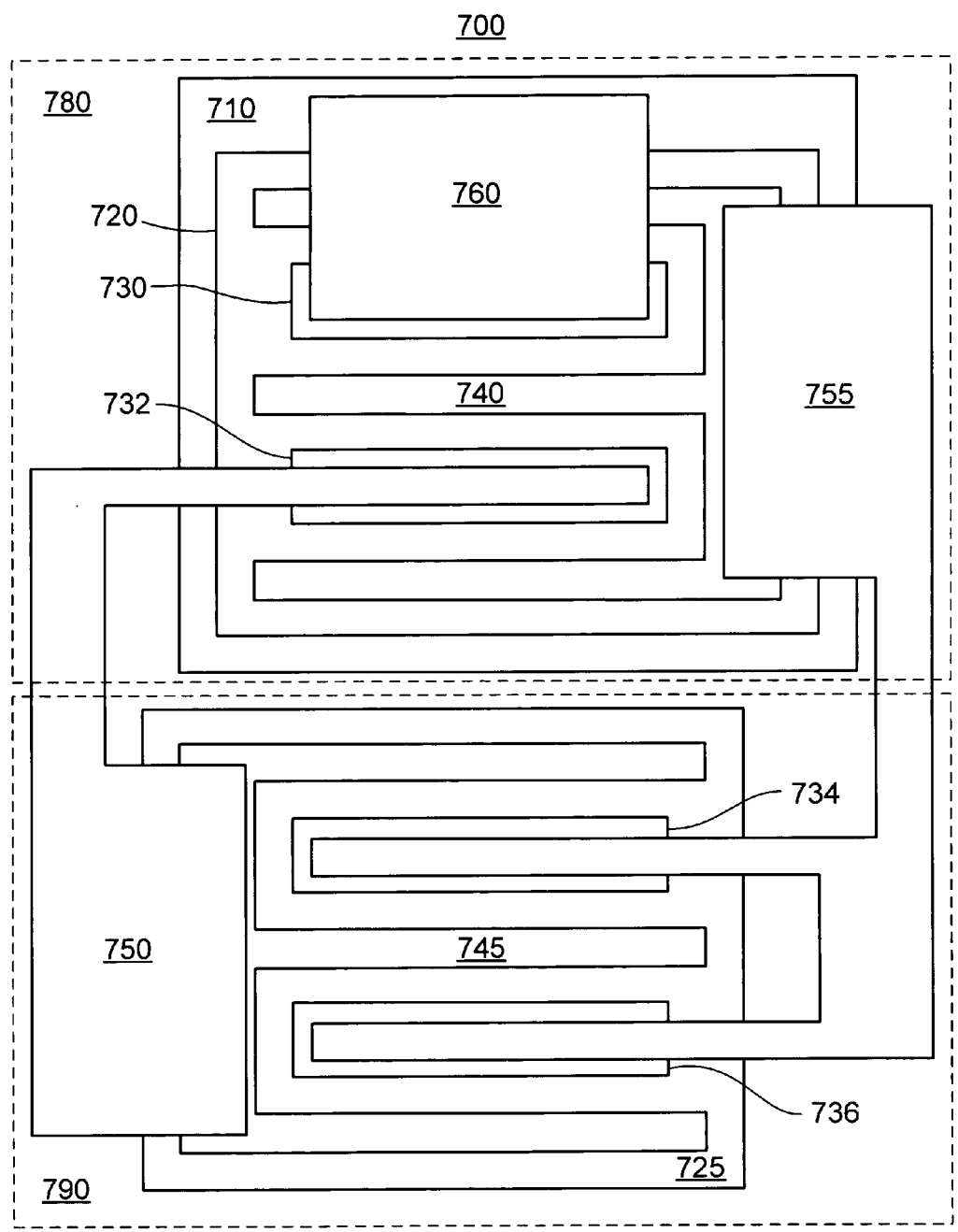
FIG. 7 is a plan view of one embodiment of the present invention.

FIG. 7 is a plan view of an embodiment of the present invention. In FIG. 7, the boundaries of some structures have been displaced slightly to more clearly show the overlapping structures and the dielectric layers have been removed to more clearly show the active structures and their interconnects. In FIG. 7, an ESD circuit 700 includes a first structure 780 defining an integrated trigger diode and clamping transistor and a second structure defining a leakage diode 790.

The integrated trigger diode and clamping transistor 780 includes a diode emitter finger 730 and a transistor emitter finger 732 over a first base layer 720. The diode emitter finger 730 and first base layer 720 form a pn junction of the trigger diode. The transistor emitter finger 732 and first base layer 720 form a base-emitter junction of the clamping transistor. A first interconnect 750 provides an electrical connection between the transistor emitter finger 732 and a second base contact 745 of the leakage diode 790. An interdigitated base contact 740 provides an electrical connection between the first base layer 720 and a second interconnect 755. The second interconnect 755 provides an electrical connection between the first base layer 720 of the integrated diode/transistor 780 and first and second emitter fingers 734 and 736 of the leakage diode 790. A third interconnect 760 provides an electrical connection between the diode emitter finger 730 and a collector layer 710.

The leakage diode 790 includes first and second emitter fingers 734 and 736 over a second base layer 725 that forms a pn junction of the leakage diode 790. The interdigitated base contact 745 provides an electrical connection between the first interconnect 750 and the leakage diode base 725. The second interconnect 755 provides an electrical connection between emitters 734 and 736 and the first base layer 720 of the integrated diode/transistor 780.

Figure 8:
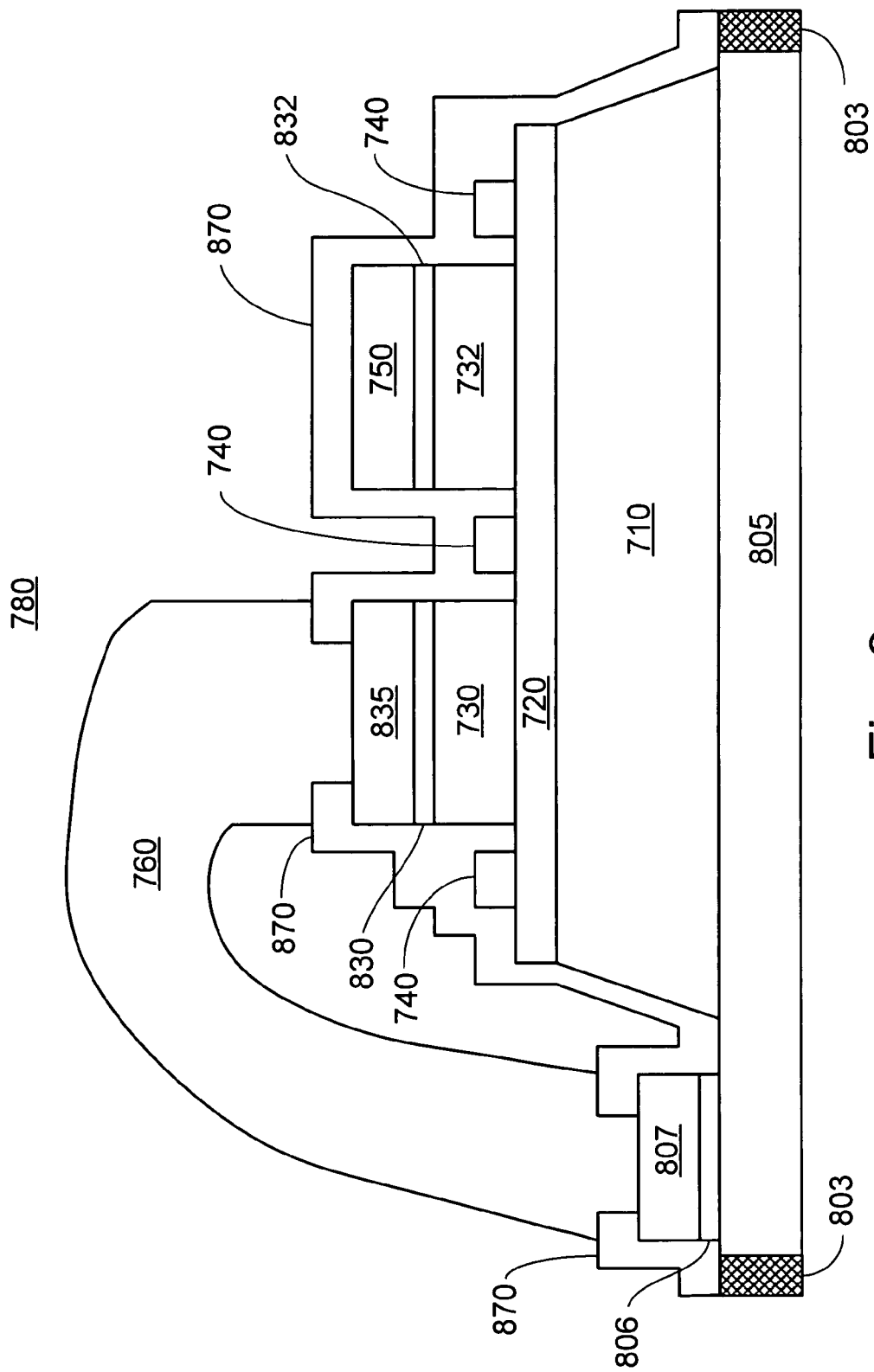
FIG. 8 is a cross-sectional view of an integrated trigger diode and clamp transistor in the embodiment shown in FIG. 7.

FIG. 8 is a cross-sectional view of the integrated diode/transistor 780 of FIG. 7. In FIG. 8, structures corresponding to the same structures in FIG. 7 are referenced with the same reference number as that used in FIG. 7. The integrated diode/transistor 780 may be fabricated using semiconductor fabrication techniques such as those described at pages 332-530 of S. M. Sze, "Semiconductor Devices: Physics and Technology," $2^{nd}$ Ed., John Wiley & Sons, Inc. (2002), or at pages 1105-1136 of William Liu, "Handbook of III-V Heterojunction Bipolar Transistors," John Wiley & Sons Inc., New York, 1998, which are both incorporated herein by reference. Air bridge 760 may be fabricated as described in U.S. Pat. No. 6,724,067 issued Apr. 20, 2004 to Bayraktaroglu incorporated herein by reference in its entirety.

The structure shown in FIG. 8 is fabricated from a layered semiconductor structure having a substrate (not shown), subcollector 805, collector 710, base 720, and emitter layers. Each layer may be epitaxially grown and doped using the methods described in Sze to produce semiconductor layers with the desired properties. The lateral structures may be formed using photolithography, implantation, deposition, and etching techniques described in Sze to define and isolate the semiconductor devices such as the integrated diode/transistor 780 of FIG. 8.

In FIG. 8, subcollector layer 805 is supported by a substrate (not shown) and provides support for collector layer 710. The subcollector layer 805 may be a very heavily doped semiconductor having high electrical conductivity relative to the conductivity of the un-doped semiconductor. An isolation barrier 803 surrounds the integrated diode/transistor device 780 and electrically isolates the device 780 from other devices on the same die. The isolation barrier 803 may be formed by ion implantation into the subcollector that forms an insulating barrier around the integrated diode/transistor device 780. The subcollector layer 805 provides an electrical connection between collector layer 710 and a collector contact 806.

Base layer 720 is disposed on the collector layer 710 and forms a pn junction. The emitter layer is etched to form a diode emitter finger 730 and a transistor emitter finger 732 on the base layer 720. A pn junction is formed between the diode emitter finger 730 and the base layer 720. A base-emitter junction is formed between the transistor emitter finger 732 and the base layer 720. As shown in FIG. 8, the trigger diode and clamping transistor share the same base layer 720 and collector layer 710. The interdigitated base contact 740 is disposed on the base layer 720 and provides an electrical contact for the base layer 720. A metal contact 832 is disposed on the transistor emitter finger 732 and provides an electrical connection between the transistor emitter finger 732 and a metal interconnect 750. Electrical connection to the diode emitter finger 730 may include a metal layer 830 and a metal interconnect layer 835. The metal interconnect layer 835 may be connected to the collector 710 through a metal air bridge 760 such as the one described in U.S. Pat. No. 6,724,067, for example. The air bridge 760 is deposited on a collector contact, which may include a metal contact 806 and a metal interconnect contact 807.

An insulating layer 870 is disposed to cover the semiconductor structures of the integrated device 780. The insulating layer 870 may be an insulating material such as an oxide, nitride or non-conducting polymer such as polyimide, for example. The insulating layer 870 may be deposited as a single layer or as multiple layers and electrically isolates the integrated device from unwanted electrical shorts. The insulating layer 870 also acts as a passivation layer to protect the device 780 from environmental degradation.

Figure 9:
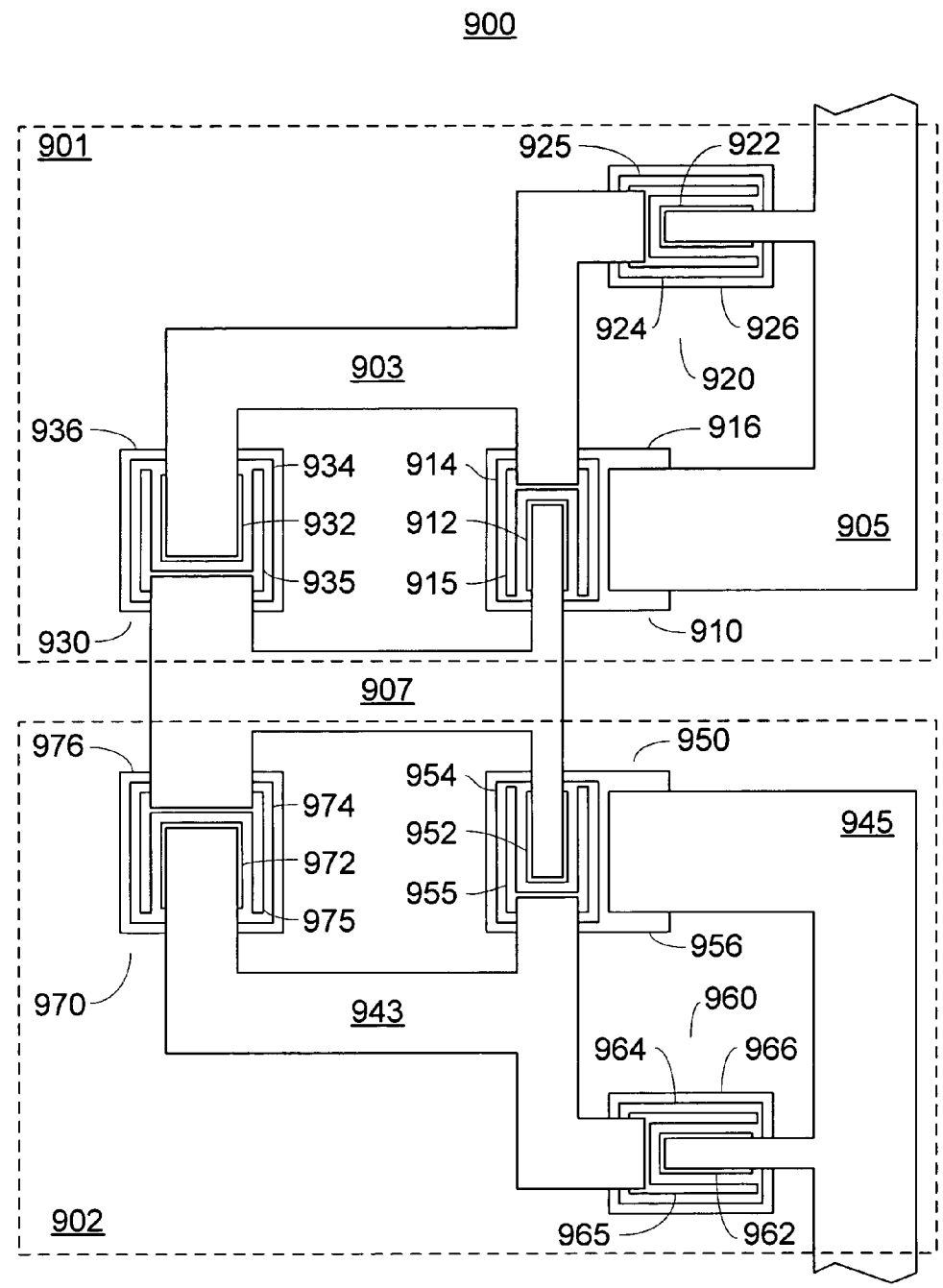
FIG. 9 is a plan view of another embodiment of the present invention.

FIG. 9 is a plan view of another embodiment of the present invention. In FIG. 9, the boundaries of some structures have been displaced slightly to more clearly show the overlapping structures. The dielectric layers are not shown in FIG. 9 to more clearly show the semiconductor structures and their interconnects.

A symmetric ESD circuit 900 includes a first ESD circuit 901 and a second ESD circuit 902 connected back-to-back via interconnect 907. In FIG. 9, the first ESD circuit 901 is shown indicating a separate clamping transistor 910 and trigger diode 920 although an integrated diode/transistor such as that described in FIG. 7 may be substituted in either or both of the circuits 901 and 902.

The first ESD circuit 901 includes a clamping transistor 910, a trigger diode 920, and a leakage diode 930. The clamping transistor 910 includes an emitter finger 912 disposed on a base layer 914. The base layer 914 is disposed over a collector layer 916, which is over a subcollector (not shown). A base contact 915 provides an electrical connection between the base layer 914 and an internal interconnect 903. Electrical isolation from the other devices on the die may be provided by converting a portion of the subcollector layer surrounding the collector 916 to a low conductivity material by ion implantation, for example.

The trigger diode 920 of the first ESD circuit 901 includes an emitter finger 922 disposed on a base layer 924. The base layer 924 is disposed over a collector layer 926, which is over a subcollector (not shown). A base contact 925 provides an electrical connection between the base layer 924 and the internal interconnect 903. Electrical isolation from the other devices on the die may be provided by converting a portion of the subcollector layer surrounding the collector 926 to a low conductivity material by ion implantation, for example.

The leakage diode 930 of the first ESD circuit 901 includes an emitter finger 932 disposed on a base layer 934. In a preferred embodiment, the area of the emitter finger 932 in contact with the base layer 934 of the leakage diode is sized to be larger than the area of the trigger diode emitter finger 922. It is believed that the close proximity, preferably within 50 μm of each other, of the trigger diode 920 to the leakage diode 930 reduces the effect of any fabrication variations resulting in a "matched" pair of diodes with similar i-v characteristics. The larger pn junction of the leakage diode is believed to siphon off the leakage current from the trigger diode 920 and away from the base of the clamping transistor 910, thereby keeping the clamping transistor 910 off until the reverse voltage across the trigger diode 920 exceeds the sum of the reverse bias breakdown voltage of the trigger diode 920 plus the base-emitter turn-on voltage (the base-emitter diode junction drop) of the clamping transistor 910. The base layer 934 is disposed over a collector layer 936, which is over a subcollector (not shown). A base contact 935 provides an electrical connection between the base layer 934 and the interconnect 907. Electrical isolation from the other devices on the die may be provided by converting a portion of the subcollector layer surrounding the collector 936 to a low conductivity material by ion implantation, for example.

The internal interconnect 903 for the first ESD circuit 901 provides an electrical connection between the base layer 924 of the trigger diode 920, the base 914 of the clamping transistor 910, and the emitter layer 932 of the leakage diode 930. An external interconnect 905 of the first ESD circuit 901 provides an electrical connection between the emitter layer 922 of the trigger diode 920, the subcollector of the clamping transistor 910, and a bond pad (not shown) or other internal connection point of the circuit.

In the illustrative embodiment shown in FIG. 9, the second ESD circuit 902 includes the same components as in the first ESD circuit 901. In FIG. 9, structures in the second ESD circuit 902 corresponding to the same structures in the first ESD circuit 901 are indicated by reference numbers that are incremented by 40 to the corresponding reference number in the first ESD circuit 901.

The second ESD circuit 902 includes a clamping transistor 950, a trigger diode 960, and a leakage diode 970. The clamping transistor 950 includes an emitter finger 952 disposed on a base layer 954. The base layer 954 is disposed over a collector layer 956, which is over a subcollector (not shown). A base contact 955 provides an electrical connection between the base layer 954 and an internal interconnect 943. Electrical isolation from the other devices on the die may be provided by converting a portion of the subcollector layer surrounding the collector 956 to a low conductivity material by ion implantation, for example.

The trigger diode 960 of the second ESD circuit 902 includes an emitter finger 962 disposed on a base layer 964. The base layer 964 is disposed over a collector layer 966, which is over a subcollector (not shown). A base contact 965 provides an electrical connection between the base layer 964 and the internal interconnect 943. Electrical isolation from the other devices on the die may be provided by converting a portion of the subcollector layer surrounding the collector 966 to a low conductivity material by ion implantation, for example.

The leakage diode 970 of the second ESD circuit 902 includes an emitter finger 972 disposed on a base layer 974. In a preferred embodiment, the area of the emitter finger 972 in contact with the base layer 974 of the leakage diode 970 is sized to be larger than the area of the trigger diode emitter finger 962. It is believed that the close proximity, preferably within 50 μm of each other, of the trigger diode 960 to the leakage diode 970 reduces the effect of any fabrication variations resulting in a "matched" pair of diodes with similar i-v characteristics. The larger pn junction of the leakage diode is believed to siphon off the leakage current from the trigger diode 960 and away from the base of the clamping transistor 950, thereby keeping the clamping transistor 950 off until the reverse voltage across the trigger diode 960 exceeds the sum of the reverse bias breakdown voltage of the triggering diode 960 plus the base-emitter turn-on voltage (the base-emitter diode junction drop) of the clamping transistor 950. The base layer 974 of the leakage diode 970 is disposed over a collector layer 976, which is over a subcollector (not shown). A base contact 975 provides an electrical connection between the base layer 974 and the interconnect 907. Electrical isolation from the other devices on the die may be provided by converting a portion of the subcollector layer surrounding the collector 976 to a low conductivity material by ion implantation, for example.

The internal interconnect 943 for the first ESD circuit 902 provides an electrical connection between the base layer 964 of the trigger diode 960, the base 954 of the clamping transistor 950, and the emitter layer 972 of the leakage diode 970. An external interconnect 945 of the second ESD circuit 902 provides an electrical connection between the emitter layer 962 of the trigger diode 960, the subcollector of the clamping transistor 950, and a bond pad (not shown) or other internal connection point of the circuit.

Having thus described at least illustrative embodiments of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

What is claimed:

1. An ESD protection circuit comprising:
   a clamping transistor, the clamping transistor having a base;
   a triggering transistor, the triggering transistor having a base connected to the base of the clamping transistor;
   a leakage transistor, the leakage transistor having an emitter connected to the base of the clamping transistor;
   a first port, the first port connected to a collector of the clamping transistor and connected to an emitter of the triggering transistor; and
   a second port, the second port connected to an emitter of the clamping transistor and connected to a base of the leakage transistor.

2. The circuit of claim 1 wherein the triggering transistor is matched to the leakage transistor.

3. The circuit of claim 2 wherein a base-emitter junction area of the leakage transistor is greater than a base-emitter junction area of the triggering transistor.

4. The circuit of claim 1 wherein the triggering transistor has a base-emitter breakdown voltage in the range from 5 volts to 10 volts.

5. An ESD protected circuit comprising:
   a microelectronic circuit having at least one power supply port;
   a first ESD protection circuit wherein a first port of the first ESD protection circuit is connected to a power supply and a second port of the first ESD protection circuit is connected to the at least one power supply port of the microelectronic circuit; and a second ESD protection circuit wherein a first port of the second ESD protection circuit is connected to ground and a second port of the second ESD protection circuit is connected to the at least one power supply port of the microelectronic circuit;
wherein the first ESD protection circuit comprises:
a clamping transistor, the clamping transistor having a base;
a triggering transistor, the triggering transistor having a base connected to the base of the clamping transistor;
a leakage transistor, the leakage transistor having an emitter connected to the base of the clamping transistor;
a first port, the first port connected to a collector of the clamping transistor and connected to an emitter of the triggering transistor; and
a second port, the second port connected to an emitter of the clamping transistor and connected to a base of the leakage transistor.

6. An ESD protected circuit comprising:
a microelectronic circuit having at least one power supply port;
a first ESD protection circuit wherein a first port of the first ESD protection circuit is connected to a power supply and a second port of the first ESD protection circuit is connected to the at least one power supply port of the microelectronic circuit; and
a second ESD protection circuit wherein a first port of the second ESD protection circuit is connected to ground and a second port of the second ESD protection circuit is connected to the at least one power supply port of the microelectronic circuit;
wherein the second ESD protection circuit comprises:
a clamping transistor, the clamping transistor having a base;
a triggering transistor, the triggering transistor having a base connected to the base of the clamping transistor;
a leakage transistor, the leakage transistor having an emitter connected to the base of the clamping transistor;
a first port, the first port connected to a collector of the clamping transistor and connected to an emitter of the triggering transistor; and
a second port, the second port connected to an emitter of the clamping transistor and connected to a base of the leakage transistor.

7. The ESD protected circuit of claim 6 wherein the triggering transistor is matched to the leakage transistor.

8. The ESD protected circuit of claim 7 wherein a base-emitter junction area of the leakage transistor is greater than a base-emitter junction area of the triggering transistor.

9. The ESD protected circuit of claim 6 wherein the triggering transistor has a base-emitter breakdown voltage in the range from 5 volts to 10 volts.

10. An ESD protected circuit comprising:
a microelectronic circuit having at least one power supply port;
a first ESD protection circuit wherein a first port of the first ESD protection circuit is connected to a power supply and a second port of the first ESD protection circuit is connected to the at least one power supply port of the microelectronic circuit; and
a second ESD protection circuit wherein a first port of the second ESD protection circuit is connected to ground and a second port of the second ESD protection circuit is connected to the at least one power supply port of the microelectronic circuit;
wherein the first ESD protection circuit comprises:
a clamping transistor, the clamping transistor having a base, an emitter, and a collector;
a first port connected to the collector of the clamping transistor; a
second port connected to the emitter of the clamping transistor;
a triggering diode having an anode and a cathode, the anode of the triggering diode connected to the base of the clamping transistor and the cathode of the triggering diode connected to the first port; and
a leakage diode having an anode and a cathode, the anode of the leakage diode connected to the emitter of the clamping transistor and the cathode of the leakage diode connected to the base of the clamping transistor.

11. An ESD protected circuit comprising:
a microelectronic circuit having at least one power supply port;
a first ESD protection circuit wherein a first port of the first ESD protection circuit is connected to a power supply and a second port of the first ESD protection circuit is connected to the at least one power supply port of the microelectronic circuit; and
a second ESD protection circuit wherein a first port of the second ESD protection circuit is connected to ground and a second port of the second ESD protection circuit is connected to the at least one power supply port of the microelectronic circuit;
wherein the second ESD protection circuit comprises:
a clamping transistor, the clamping transistor having a base, an emitter, and a collector;
a first port connected to the collector of the clamping transistor; a
second port connected to the emitter of the clamping transistor;
a triggering diode having an anode and a cathode, the anode of the triggering diode connected to the base of the clamping transistor and the cathode of the triggering diode connected to the first port; and
a leakage diode having an anode and a cathode, the anode of the leakage diode connected to the emitter of the clamping transistor and the cathode of the leakage diode connected to the base of the clamping transistor.

12. The ESD protected circuit of claim 11 wherein the triggering diode and leakage diode are matched.

13. The ESD protected circuit of claim 12 wherein a junction area of the leakage diode is greater than a junction area of the triggering diode.

14. An ESD protection circuit comprising:
a clamping transistor, the clamping transistor having a base, an emitter, and a collector;
a first port connected to the collector of the clamping transistor; a second port connected to the emitter of the clamping transistor;
a triggering diode having an anode and a cathode, the anode of the triggering diode connected to the base of the clamping transistor and the cathode of the triggering diode connected to the first port; and
a leakage diode having an anode and a cathode, the anode of the leakage diode connected to the emitter of the clamping transistor and the cathode of the leakage diode connected to the base of the clamping transistor wherein the triggering diode and leakage diode are matched and a junction area of the leakage diode is greater than a junction area of the triggering diode.

* * * * *